US010548232B2

(12) United States Patent
Ratzlaff et al.

(10) Patent No.: US 10,548,232 B2
(45) Date of Patent: Jan. 28, 2020

(54) MODULAR ENCLOSURE AND AN ASSEMBLY FOR CONSTRUCTING A MODULAR ENCLOSURE

(71) Applicant: TE CONNECTIVITY CORPORATION, Berwyn, PA (US)

(72) Inventors: Thomas D. Ratzlaff, Menlo Park, CA (US); Paul Craig Tally, Santa Clara, CA (US); Roenna Nepomuceno del Rosario, Union City, CA (US); Setha Yim, Sunnyvale, CA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/722,545

(22) Filed: Oct. 2, 2017

(65) Prior Publication Data
US 2019/0104620 A1 Apr. 4, 2019

(51) Int. Cl.
*H05K 5/00* (2006.01)
*H05K 5/02* (2006.01)
*A47B 47/00* (2006.01)
*G06F 1/18* (2006.01)
*F16B 12/22* (2006.01)
*A47B 47/04* (2006.01)
*B65D 21/02* (2006.01)

(52) U.S. Cl.
CPC ....... *H05K 5/0004* (2013.01); *A47B 47/0033* (2013.01); *A47B 47/0066* (2013.01); *G06F 1/181* (2013.01); *H05K 5/0021* (2013.01); *H05K 5/0217* (2013.01); *A47B 47/047* (2013.01); *B65D 21/0204* (2013.01); *F16B 12/22* (2013.01)

(58) Field of Classification Search
CPC ............ A47B 47/0016; A47B 47/0025; A47B 47/0033; A47B 47/0041; A47B 47/005; A47B 47/0058; A47B 47/0083; A47B 47/0091; A47B 47/03; A47B 47/045; A47B 47/047; A47B 47/05; H05K 5/0004; G06F 1/181
See application file for complete search history.

(56) References Cited

U.S. PATENT DOCUMENTS 2,956,705 A * 10/1960 Clingman .......... A47B 47/0008
217/12 R
3,754,806 A 8/1973 Nakagawa
(Continued)

FOREIGN PATENT DOCUMENTS

GB 1071700 A * 6/1967 ........... A47B 47/005
GB 2129903 A * 5/1984 ............. A47B 13/06

*Primary Examiner* — Andrew M Roersma

(57) ABSTRACT

Modular enclosure includes a plurality of structural elements coupled to one another to at least partially define a cavity. The structural elements form a plurality of sub-assemblies in which each sub-assembly includes a corner section having a slot and first and second joint sections. Each of the first and second joint sections include an elongated body extending between two joint ends. The elongated body has an open-sided channel that extends along a length of the elongated body and opens to an exterior of the elongated body. The open-sided channel extends through each of the joint ends. The slot of the corner section is aligned with the open-sided channels of the first and second joint sections and a wall section is received by the slot and each of the open-sided channels.

22 Claims, 10 Drawing Sheets

(56) References Cited

U.S. PATENT DOCUMENTS

| | | | |
|---|---|---|---|
| 3,854,783 A | 12/1974 | Teranishi | |
| 4,379,604 A | 4/1983 | Rock et al. | |
| 4,470,647 A | 9/1984 | Bishoff et al. | |
| 4,592,601 A | 6/1986 | Hlinsky et al. | |
| 4,768,845 A * | 9/1988 | Yeh | A47B 47/0008 |
| | | | 312/257.1 |
| 5,016,946 A | 5/1991 | Reznikov et al. | |
| 5,423,604 A * | 6/1995 | Chern | A47B 47/0008 |
| | | | 312/265.1 |
| 5,470,139 A * | 11/1995 | Hsiao | A47B 47/005 |
| | | | 312/111 |
| 5,564,806 A | 10/1996 | Keisling et al. | |
| 5,647,181 A | 7/1997 | Hunts | |
| 5,921,647 A | 7/1999 | Schneider et al. | |
| 5,975,660 A | 11/1999 | Tisbo et al. | |
| 6,120,116 A | 9/2000 | Phillips | |
| 6,193,340 B1 | 2/2001 | Schenker et al. | |
| 6,250,022 B1 | 6/2001 | Paz et al. | |
| 6,474,759 B2 | 11/2002 | Hsu | |
| 6,532,707 B1 | 3/2003 | Cannon | |
| 6,698,851 B1 | 3/2004 | Ludl | |
| 6,808,074 B1 * | 10/2004 | Schwartz | A47F 3/005 |
| | | | 206/577 |
| 6,820,950 B1 | 11/2004 | Sun | |
| 7,815,264 B2 | 10/2010 | Lin et al. | |
| 7,922,417 B2 | 4/2011 | Jimenez | |
| 8,967,738 B2 | 3/2015 | Blase | |
| 9,382,038 B2 | 7/2016 | Conway et al. | |
| 9,392,708 B2 | 7/2016 | Conway et al. | |
| 2002/0043905 A1 | 4/2002 | Insalaco et al. | |
| 2002/0125799 A1 | 9/2002 | Landsberger et al. | |
| 2005/0104483 A1 | 5/2005 | Saravis | |
| 2005/0110371 A1 | 5/2005 | Li | |
| 2005/0129460 A1 * | 6/2005 | Medcalf | E06B 3/5454 |
| | | | 403/403 |
| 2016/0192509 A1 * | 6/2016 | Hacking | H05K 5/0004 |
| | | | 312/263 |

\* cited by examiner

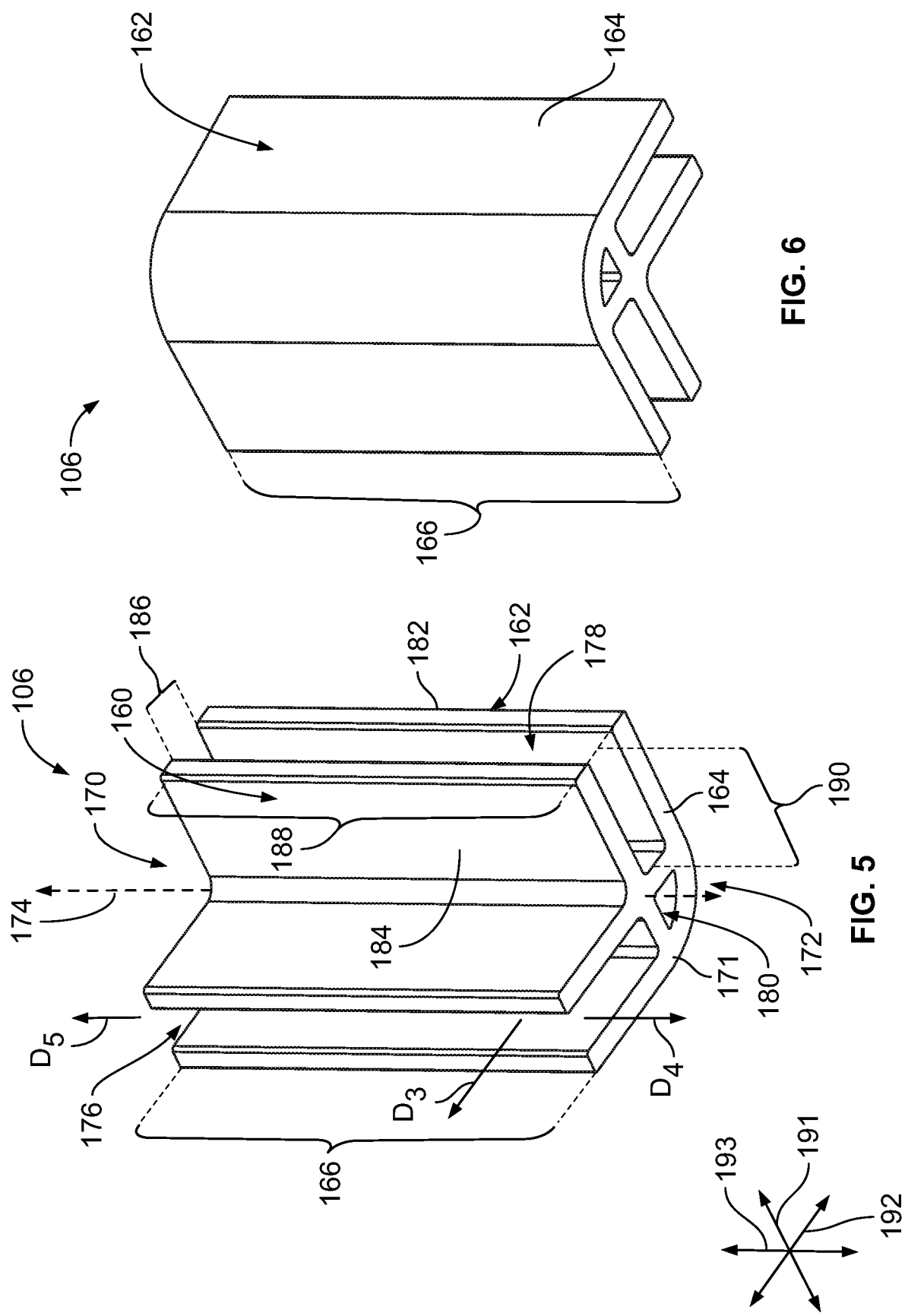

MODULAR ENCLOSURE AND AN ASSEMBLY FOR CONSTRUCTING A MODULAR ENCLOSURE

BACKGROUND

The subject matter disclosed herein relates generally to modular enclosures and modular frames that may be used to, for example, construct modular enclosures.

Modular enclosures are known for containing electrical devices (such as circuit boards, actuators, avionics, automotive electronics, and/or the like) and non-electrical devices. For example, many avionics components located on-board aircraft and many automotive electronic components located on-board automobiles are housed in modular enclosures. Known modular frames include conventional rail and panel boxes that are built using modular corner rails that include two opposite receivers for receiving two modular side panels. A plurality of side panels and corner rails are connected together to form a modular enclosure that surrounds a cavity.

Known modular frames or enclosures are not without disadvantages. For example, known modular enclosures, such as rail and panel boxes, may include a relatively large number of joints, which may decrease a rigidity of the enclosure. Modular frame or enclosures are typically available only in fixed sizes and materials. Differently configured molds, extrusion dies, and/or the like may be required to fabricate other modular frames or enclosures, which may increase the cost and/or production time.

BRIEF DESCRIPTION

In an embodiment, a modular enclosure is provided. The modular enclosure includes a plurality of structural elements coupled to one another to at least partially define a cavity. The structural elements form a plurality of sub-assemblies in which each sub-assembly includes a corner section having a slot and first and second joint sections. Each of the first and second joint sections include an elongated body extending between two joint ends. The elongated body has an open-sided channel that extends along a length of the elongated body and opens to an exterior of the elongated body. The open-sided channel extends through each of the joint ends. The slot of the corner section is aligned with the open-sided channels of the first and second joint sections and a wall section is received by the slot and each of the open-sided channels.

In some aspects, the plurality of sub-assemblies includes two of the sub-assemblies that share the corner section and the first joint section or the second joint section.

In some aspects, the plurality of sub-assemblies includes first, second, and third sub-assemblies. The first, second, and third sub-assemblies share the corner section. The first and second sub-assemblies share the first joint section. The first and third sub-assemblies share the second joint section.

In some aspects, the modular enclosure is box-shaped having at least four sides that join each other along enclosure edges and enclosure corners. The enclosure corners are formed by the corner sections. The enclosure edges are formed by the first and second joint sections and additional joint sections.

In some aspects, the elongated body has a same cross-sectional area for essentially an entire length of the elongated body.

In some aspects, the slot is a first slot and the corner section includes second and third slots. The first, second, and third slots receive respective wall sections.

In some aspects, the elongated body is a unitary body formed from material having a uniform composition.

In some aspects, the elongated body is rigid and extends linearly between the joint ends.

In an embodiment, an assembly for constructing one or more modular frames is provided. The assembly includes a plurality of corner sections. Each of the corner sections has a plurality of slots that are sized and shaped to receive corners of respective wall sections. The assembly also includes a plurality of joint sections that are configured to be positioned with respect to the corner sections. The plurality of joint sections include first and second joint sections. Each of the first and second joint sections includes an elongated body extending between joint ends and open-sided channels extending along a length of the elongated body and opening to an exterior of the elongated body. The open-sided channels extend through each of the joint ends. The corresponding slot of at least one of the corner sections is configured to align with the open-sided channel of the first joint section and the open-sided channel of the second joint section. The corresponding slot and the open-sided channel of the first joint section are sized and shaped and positionable to receive a single wall section. The corresponding slot and the open-sided channel of the second joint section are sized and shaped and are positionable to receive the single wall section.

In some aspects, the assembly also includes a plurality of wall sections including the single wall section.

In some aspects, the elongated body extends along a longitudinal axis. The elongated body has a uniform cross-sectional shape along the length such that a cross-section taken perpendicular to the longitudinal axis is essentially the same along the length of the elongated body.

In some aspects, the assembly also includes a hinge. The hinge has an open-sided channel that is configured to receive the single wall section.

In some aspects, at least one of the corner sections includes three slots that are mutually perpendicular.

In some aspects, the elongated body is a unitary body formed from material having a uniform composition. The elongated body is rigid and extends linearly between the joint ends.

In some aspects, the assembly is a packaged assembly that includes a container. The container has the corner and joint sections disposed therein.

In an embodiment, a method is provided that includes (a) receiving a corner section and first and second joint sections. The corner section has first and second slots. Each of the first and second joint sections includes an elongated body extending between two joint ends. The elongated body has an open-sided channel that extends along a length of the elongated body and opens to an exterior of the elongated body. The open-sided channel extends through each of the joint ends. The method also includes (b) inserting a wall section into the slot of the corner section and (c) inserting the wall section into the open-sided channel of the first joint section. The open-sided channel of the first joint section and the slot of the corner section are aligned. The method also includes (d) inserting the wall section into the open-sided channel of the second joint section. The open-sided channel of the second joint section and the slot of the corner section are aligned. The method also includes (e) repeating (b) and (c) with a different wall section for a different slot of the corner section in which the first joint section includes another open-sided channel such that the two wall sections are inserted into the two open-sided channels of the first joint section.

In some aspects, the method also includes (f) repeating (a)-(e) with a different corner section, different first and second joint sections, and different wall sections.

In some aspects, (b)-(e) are carried out sequentially or in a different order.

In some aspects, the method also includes slicing a larger joint section to provide at least one of the first joint section or the second joint section.

In some aspects, the elongated body is a unitary body formed from material having a uniform composition and the elongated body is rigid and extends linearly between the joint ends.

In an embodiment, a modular enclosure is provided that includes a plurality of structural elements coupled to one another to at least partially define a cavity. The structural elements include first and second joint sections. Each of the first and second joint sections has an outer wall and a mating edge. The outer walls have inner surfaces. The structural elements also include a wall section having first and second wall edges and an outer surface. The first and second wall edges join each other. The first joint section is secured to the wall section. The inner surface of the outer wall of the first joint section abuts the outer surface of the wall section and extends along the first wall edge. The second joint section is secured to the wall section. The inner surface of the outer wall of the second joint section abuts the outer surface of the wall section and extends along the second wall edge. The mating edges of the first and second joint sections engage each other. The first and second joint sections form a support frame of the modular enclosure.

In some aspects, the first joint section has a corner portion that includes an abutting surface along an inner side of the first joint section. The second joint section has a corner portion that includes an abutting surface along an inner side of the second joint section. The abutting surface of the first joint section abuts the first wall edge of the wall section and the abutting surface of the second joint section abuts the second wall edge of the wall section.

In some aspects, the wall section is a first wall section. The modular enclosure also includes a third joint section having an outer wall and a mating edge. The outer wall has an inner surface. The modular enclosure also includes a second wall section having first and second wall edges and an outer surface. The first and second wall edges join each other. The third joint section is secured to the second wall section. The inner surface of the outer wall of the third joint section abuts the outer surface of the second wall section and extends along the second wall edge. The mating edges of the first, second, and third joint sections engage one another at the corner of the modular enclosure.

BRIEF DESCRIPTION OF THE DRAWINGS

FIG. 5 is an isolated view of a joint section that may be used with the modular enclosure of FIG. 1.

FIG. 6 is a different isolated view of the joint section of FIG. 5.

DETAILED DESCRIPTION

Figure 1:
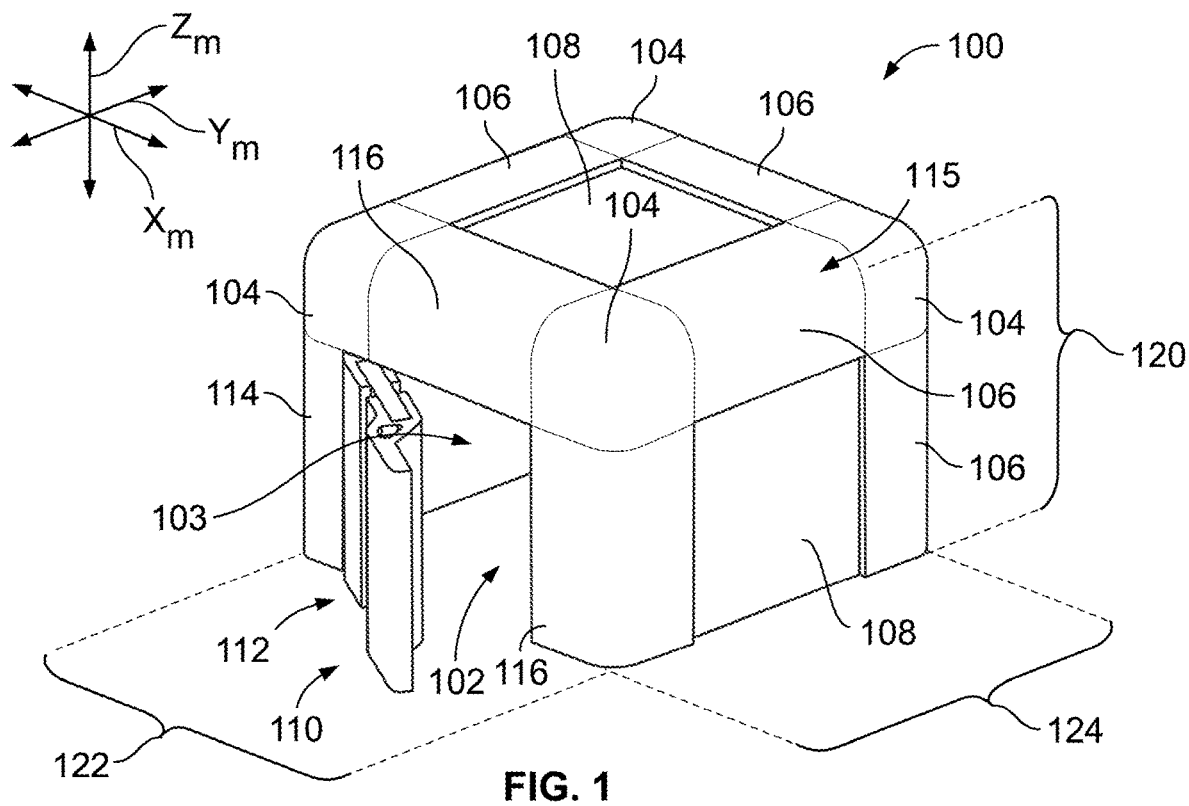
FIG. 1 is a top perspective view of a modular enclosure formed in accordance with an embodiment.

Embodiments set forth herein include modular frames and enclosures and groups, sets, or assemblies of the elements that are used to make the modular frames or enclosures. A "modular frame" is a frame constructed from a plurality of discrete structural elements in which at least two or more of the structural elements are of the same type. A "modular enclosure" includes a modular frame with walls or wall sections connected thereto to separate a cavity of the enclosure from an exterior. Optionally, the discrete structural elements may have unitary bodies. For example, a single material having uniform composition may be molded or machined. In other embodiments, a discrete structural element may have a plurality of parts or portions coupled to one another.

The modular frames and enclosures include discrete structural elements (e.g., wall sections, joint sections, corner sections) that are readily coupled to one another to form the enclosure. At least some of the structural elements (e.g., joint sections, corner sections, etc.) may cooperate with one another to form a support frame of the modular enclosure that securely holds the wall sections. The structural elements may be used to make modular enclosure having a variety of sizes and/or shapes. In some embodiments, the modular enclosures may be "cut-to-order" such that at least one element (e.g., joint section) may be cut upon request by a purchaser. This element, regardless of its size, may be used with other pre-formed elements. The modular enclosures may also include optional elements, such as hinges, latches, handles, edge reinforcement, non-planar wall sections (e.g., designed for a particular function or aesthetic), or elements that enable mounting the enclosure to a wall or rack.

Non-limiting examples of materials that may be used to manufacture the elements of the modular enclosure include composite plastics (e.g., short fiber or long fiber), aluminum, stainless steel, mild steel, titanium, brass, copper, fiberboard, wood, and/or natural fiber reinforced. The materials may have many qualities. For example, the material may be light, heavy, transparent or translucent, insulating, thermally conductive, tough, flexible, rigid, plated, unplated, metallized (e.g., spray coating), and/or reflective.

As used herein, the term "configured to" does not mean mere capability in a hypothetical or theoretical sense, but means that the referenced element is designed, relative to other elements, to accomplish the intended objective. For example, the joint sections, corner sections, and wall sections of some embodiments are "configured to" connect to one another to form a modular enclosure. In other words, the joint sections, corner sections, and wall sections are designed to connect to one another to form a modular enclosure that surrounds a cavity and that maintains its structural integrity in expected environments or situations for a relevant period of time.

As used herein, phrases such as "a plurality of [elements]" and the like, when used in the detailed description and claims, do not necessarily include each and every element that a component or assembly may have. The component or assembly may have other elements that are similar to the plurality of elements. For example, the phrase "a plurality of joint sections [being/having a recited feature]" does not necessarily mean that each and every joint section of the component or assembly has the recited feature. Other joint sections may not include the recited feature. Accordingly, unless explicitly stated otherwise (e.g., "each and every joint section of the assembly [being/having a recited feature]" or "each and every joint section of the modular enclosure [being/having a recited feature]"), embodiments may include similar elements that do not have the recited features.

Figure 2:
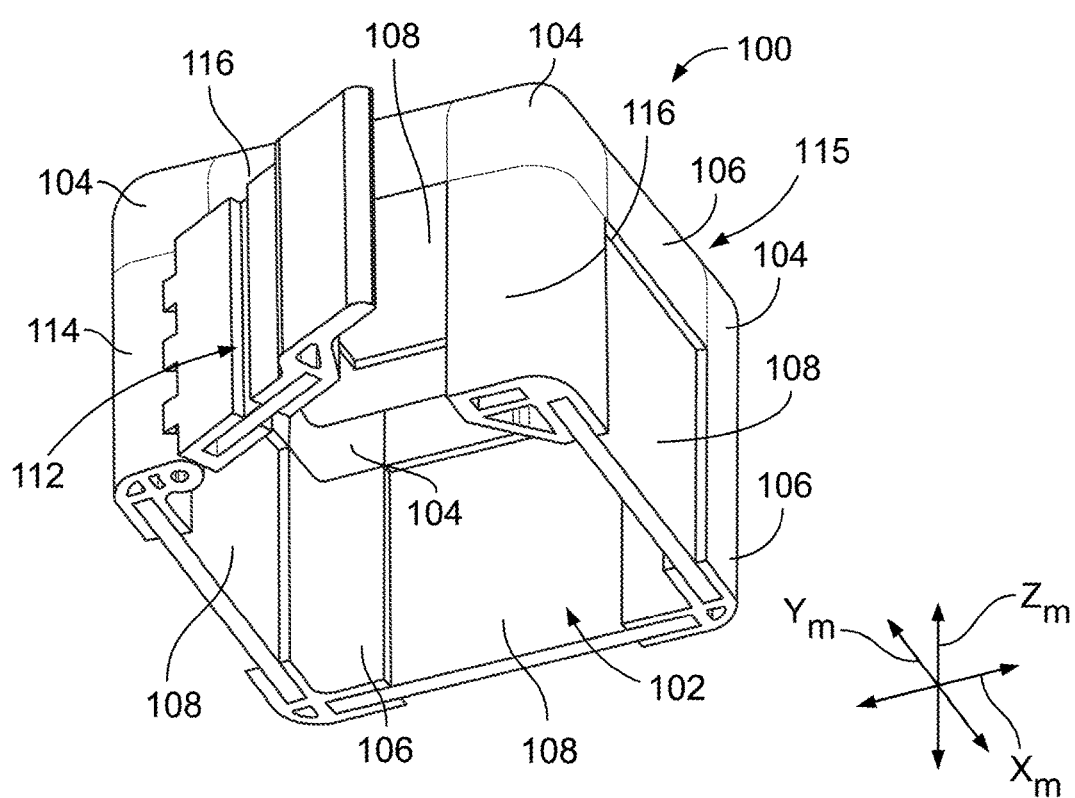
FIG. 2 is a bottom perspective of the modular enclosure of FIG. 1.

FIG. 1 is a top perspective view of a modular enclosure 100 formed in accordance with an embodiment, and FIG. 2 is a bottom perspective of the modular enclosure 100. The modular enclosure 100 surrounds a cavity 102 (or compartment) and be used to house or enclose items (e.g., electronics) within the cavity 102. For reference, the modular enclosure 100 is oriented with respect to mutually perpendicular $X_m$, $Y_m$, and $Z_m$ axes. For illustrative purposes, however, different elements may be described with respect to a different set of axes. It should be understood that the modular enclosure 100 may have any orientation with respect to gravity.

The modular enclosure 100 includes a plurality of structural elements 104, 106, 108 that combine to form the modular enclosure 100. The structural elements 104, 106, 108 include outer corner sections 104, joint sections 106, and wall sections 108. Optionally, the structural elements also include a sub-assembly 110, which includes a cover device 112 and a hinge device 114. The sub-assembly 110 may be referred to as a wall sub-assembly 110. The sub-assembly 110 may be used to cover an access opening 103 to the cavity 102. The joint sections 106 and corner sections 104 form a support frame 115 of the modular enclosure 100. The support frame 115 securely holds the wall sections.

Optionally, the structural elements also include support sections 116. It should be understood that similar elements may have different sizes and/or shapes. For example, two wall sections 108 may have different shapes, and two joint sections 106 may have different lengths. Although not shown, another structural element may include an inner corner section such that the modular enclosure may resemble two steps (or more) of a staircase. The inner corner section may be similar or identical to the outer corner section.

The structural elements may be manufactured using one or more processes. For example, the structural elements may be molded, extruded, or 3D-printed. Optionally, the structural elements may be formed with another element. In particular embodiments, the joint sections 106 are extruded and may have an indeterminate length. For instance, a single joint section 106 may be extruded to have a length of one meter and then cut (e.g., sliced) into discrete joint sections 106. The structural elements may also be selectively modified. For example, one or more of the wall sections 108 may have the surface(s) of the wall section physically modified (e.g., cut, roughened) and/or chemically modified (e.g., coated with a designated material).

The structural elements may be combined to form a modular enclosure of a desired size and shape. In other words, the size and shape may be selected by the intended user. The user may assemble the modular enclosures or may request that the vender or manufacturer assemble the modular enclosures prior to shipping. With respect to FIG. 1, the modular enclosure 100 has a height 120, a first lateral dimension 122, and a second lateral dimension 124. Alternatively, the dimensions 122, 124 may be referred to as the width 122 and the depth 124, respectively, or may be referred to as the first width 122 and the second width 124, respectively. The height 120, the first lateral dimension 122, and the second lateral dimension 124 may be determined based on the size of the joint sections 106.

Figure 3:
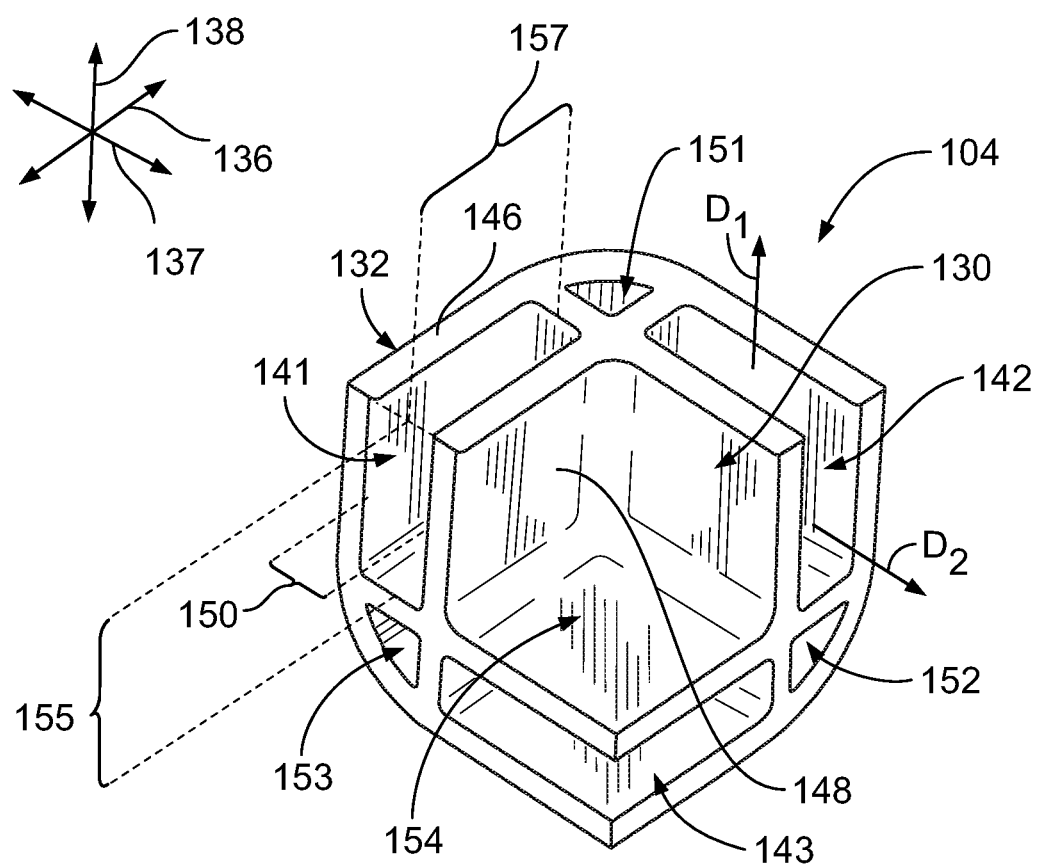
FIG. 3 is an isolated view of a corner section that may be used with the modular enclosure of FIG. 1.
Figure 4:
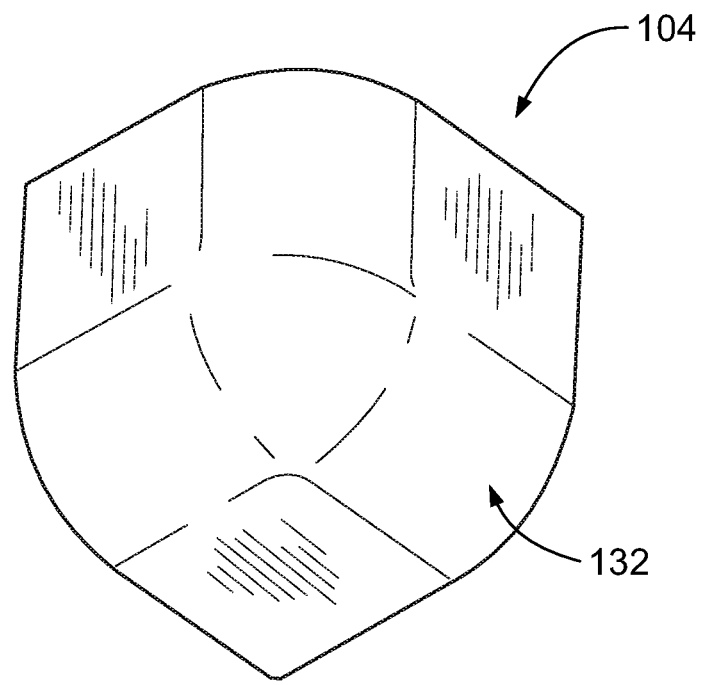
FIG. 4 is a different isolated view of the corner section of FIG. 3.

FIGS. 3 and 4 are isolated perspective views of the corner section 104. The modular enclosure 100 (FIG. 1) includes four (4) corner sections 104, but fewer or more may be used in other embodiments. The corner section 104 includes an inner surface or side 130 (FIG. 3) and an outer surface or side 132 (FIG. 4). In some embodiments, the inner surface 130 faces the cavity 102 (FIG. 1), and the outer surface 132 faces an exterior of the modular enclosure 100. However, in other embodiments (e.g., staircase-like embodiments), the corner section 104 may be inverted and face the exterior of the modular enclosure.

With respect to FIG. 3, the corner section 104 is oriented with respect to first, second, and third axes 136, 137, 138 for reference. The corner section 104 includes a first slot 141, a second slot 142, and a third slot 143. The corner section 104 also includes a first void 151, a second void 152, and a third void 153. In alternative embodiments, the corner section 104 may include fewer or more slots and/or may include fewer or more voids.

The first, second, and third slots 141-143 are sized, shaped, and positioned to receive portions of respective wall sections 108 (FIG. 1). For example, each slot is defined by an outer slot wall 146 and an inner slot wall 148. The outer slot wall 146 defines a portion of the outer surface 132. The inner slot wall 148 defines a portion of the cavity 102 (FIG. 1). Each slot has a slot width 150, a slot height 155, and a slot length 157. The slot height 155 and slot length 157 may be essentially equal. The slot width 150 is configured relative to the wall section that the corresponding slot will receive. For example, the slot width 150 may be designed to form an interference fit with the corresponding portion of the wall section. The slot width 150 is essentially uniform throughout in the illustrated embodiment, but it is contemplated that the slot width may be variable to receive wall section with varying thicknesses. Each slot opens in a first direction $D_1$ and in a second direction $D_2$ such that a corner of the wall section 108 may be received.

Each of the first, second, and third slots 141, 142, 143 is configured to receive a corresponding portion of a wall section that extends parallel to a respective plane. More specifically, the first slot 141 is configured to receive a portion of the corresponding wall section 108 that extends parallel to a plane defined by the first axis 136 and the third axis 138. The second slot 142 is configured to receive a portion of the corresponding wall section 108 that extends parallel to a plane defined by the second axis 137 and the third axis 138. The third slot 143 is configured to receive a portion of the corresponding wall section 108 that extends parallel to a plane defined by the first axis 136 and the second axis 137.

As such, the slots 141-143 are sized and shaped and positioned such that the two largest dimensions defining the respective slot extend parallel to the respective plane. For example, the two largest dimensions of the slot 141 extend along the first axis 136 and the third axis 138. The two largest dimensions of the slot 142 extend along the second axis 137 and the third axis 138. The two largest dimensions of the slot 143 extend along the first axis 136 and the second axis 137. For the illustrated embodiment, the slots 141-143 may be characterized as being mutually perpendicular to one another. It should be understood, however, that the slots 141-143 are not required to be mutually perpendicular.

The voids 151-153 may be configured to receive one or more structural parts (e.g., posts or rods) that may add structural integrity to the modular enclosure. However, the voids 151-153 are not required to have a function. For example, the voids 151-153 may reduce the amount of material used to form the corner section. The inner slot walls 148 of the slots 141-143 form a recessed area 154 of the corner section 104 that may define a portion of the cavity 102 (FIG. 1). In the illustrated embodiment, the inner slot walls 148 are rectangular-shaped. In other embodiments, the inner slot walls 148 may have different shapes.

With respect to FIG. 4, in the illustrated embodiment, the outer surface 132 is smooth and forms a rounded corner. In alternative embodiments, one or more corner sections may have outer surfaces that are not smooth and/or are irregularly shaped. In an alternative embodiment, the first and second slots 141, 142 open to the inner surface 130 as shown in FIG. 3, but the third slot 143 opens to the outer surface 132.

FIGS. 5 and 6 are isolated perspective views of the joint section 106. The modular enclosure 100 (FIG. 1) includes five (5) joint sections 106, but fewer or more may be used in other embodiments. The joint section 106 includes an inner surface or side 160 (FIG. 5) and an outer surface or side 162 (FIG. 6). In some embodiments, the inner surface 160 faces the cavity 102 (FIG. 1), and the outer surface 162 faces the exterior of the modular enclosure 100. The joint section 106 has an elongated body 164 having a length 166. The length 166 may be indeterminate and may be selected based upon the intended purpose of the modular enclosure. In some embodiments, the elongated body 164 may be rigid or inflexible. In particular embodiments, the elongated body 164 is linear.

In other embodiments, the elongated body 164 may have other shapes. For example, the elongated body may be L-shaped in which the two legs of the elongated body have an indeterminate length. In some embodiments, the elongated body 164 may be flexible such that the elongated body may have a non-linear shape. For embodiments in which the elongated body is non-linear or capable of being flexed into a non-linear shape, the wall sections may be non-planar. For reference, the joint section 106 is oriented with respect to mutually perpendicular axes 191-193.

As shown in FIG. 5, the elongated body 164 of the joint section 106 extends linearly between opposite joint ends 170, 172. The opposite ends 170, 172 are defined by respective surfaces 171. The surfaces 171 may have cross-sectional dimensions that, in some embodiments, are maintained throughout the length 166. The surfaces 171 may be formed when the joint section 106 is cut (e.g., with an object or laser). As shown, the entire surface 171 coincides with a plane that is parallel to the axes 191, 192. Optionally, the end 170 and/or the end 172 may be cut such that the surface is not planar.

The joint section 106 is oriented with respect to a longitudinal axis 174 that extends between the opposite ends 170, 172 and along the length 166. The joint section 106 includes open-sided channels 176, 178 that extend parallel to the longitudinal axis 174. The open-sided channels 176, 178 open along the length 166 of the joint section 106 and open at each of the ends 170, 172. The open-sided channels 176, 178 open in a direction $D_3$ that is perpendicular to the corresponding longitudinal axis 174, and open in opposite directions $D_4$, $D_5$ that are along the longitudinal axis 174. In particular embodiments, the joint section 106 has a uniform cross-section such that the joint section 106 may be sliced perpendicular to the longitudinal axis 174 and the exposed end may have the same cross-sectional area. The joint section 106 may also include an elongated void 180. Similar to the voids 151-153 (FIG. 3), the void 180 may be configured to receive a pin or post or may be configured to reduce an amount of material used for forming the joint section 106.

The open-sided channels 176, 178 are sized, shaped, and positioned to receive portions of respective wall sections 108 (FIG. 1). The open-sided channels 176, 178 are also designed to align with two of the slots 141, 142, 143 (FIG. 3). For example, each open-sided channel is defined by an outer channel wall 182 and an inner channel wall 184. The outer channel wall 182 defines a portion of the outer surface 162. The inner channel wall 184 defines a portion of the cavity 102 (FIG. 1). Each open-sided channel has a channel width 186, a channel length 188, and a channel height 190. The channel length 188 may be essentially equal to the body length 166 of the elongated body 164.

The channel width 186 is configured relative to the wall section that the corresponding channel will receive. For example, the channel width 186 may be designed to form an interference fit with the corresponding portion of the wall section. The channel width 186 is essentially uniform throughout in the illustrated embodiment, but it is contemplated that the channel width may be variable to receive wall sections with varying thicknesses. In particular embodiments, the channel width 186 is essentially equal to the slot width 150 (FIG. 3). The channel height 190 may also be essentially equal to the slot height 155 or slot length 157 (FIG. 3).

In alternative embodiments, the joint section 106 do not include open-sided channels. For example, the joint section 106 may include two outer walls that are oriented transverse to one another. Such an embodiment is described with reference to FIGS. 13-17.

Figure 7:
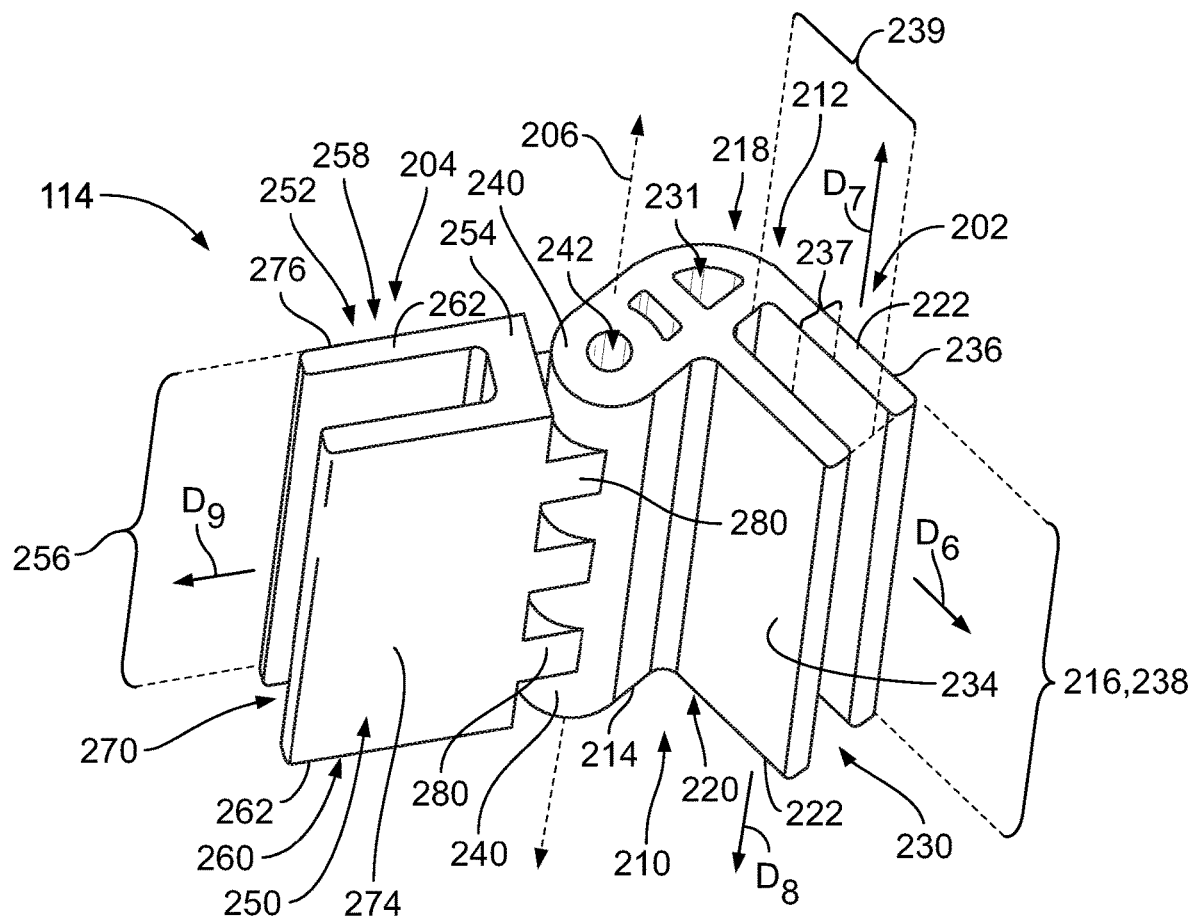
FIG. 7 illustrates a hinge device that may be used with the modular enclosure of FIG. 1.

FIG. 7 illustrates a hinge device 114 that includes a first hinge element 202 and a second hinge element 204. The first and second hinge elements 202, 204 are rotatably coupled such that one or each of the first and second hinge elements 202, 204 is rotatable about a hinge axis 206. The modular enclosure 100 (FIG. 1) includes only one hinge device 114, but it is contemplated that more than one may be used. Alternatively, modular enclosures may be devoid of a hinge device.

The first hinge element 202 includes an inner surface or side 210 and an outer surface or side 212. In some embodiments, the inner surface 210 faces the cavity 102 (FIG. 1), and the outer surface 212 faces the exterior of the modular enclosure 100. The first hinge element 202 has an elongated body 214 having a length 216. The length 216 may be indeterminate and may be selected based upon the intended purpose of the modular enclosure.

The elongated body 214 of the first hinge element 202 extends linearly between opposite ends 218, 220. The opposite ends 218, 220 are defined by respective surfaces 222. The surfaces 222 may be formed when the first hinge element 202 is cut. As shown, the entire surface 222 is planar (e.g., coincides with a single plane). The surfaces 222 may have cross-sectional dimensions that, in some embodiments, are maintained throughout the length 216.

The first hinge element 202 includes an open-sided channel 230 that extends parallel to the hinge axis 206. The open-sided channel 230 opens along the length 216 and at each of the ends 218, 220. More specifically, the open-sided channel 230 opens in a direction $D_6$ that is perpendicular to the corresponding axis 206, and opens in opposite directions $D_7$, $D_8$ that are along the axis 206. In particular embodiments, the first hinge element 202 has a uniform cross-section such that the first hinge element may be sliced perpendicular to the axis 206 at any point and the exposed end may have the same cross-sectional dimensions. The first hinge element 202 may also include an elongated void 231. Similar to the voids 151-153 (FIG. 3), the void 232 may be configured to receive a pin or post or may be configured to reduce an amount of material used for forming the first hinge element 202.

The open-sided channel 230 of the first hinge element 202 is sized, shaped, and positioned to receive portions of a respective wall section 108 (FIG. 1). The open-sided channel 230 is also designed to align with one of the slots 141, 142, 143 (FIG. 3). For example, the open-sided channel 230 is defined by a first hinge wall 234 and a second hinge wall 236. The first hinge wall 234 defines a portion of the outer surface 212. The second hinge wall 236 defines a portion of the cavity 102 (FIG. 1). The open-sided channel 230 has a channel width 237, a channel length 238, and a channel height 239.

The channel width 237 is configured relative to the wall section that the corresponding channel will receive. For example, the channel width 237 may be designed to form an interference fit with the corresponding portion of the wall section. The channel width 237 is essentially uniform throughout in the illustrated embodiment, but it is contemplated that the channel width may be variable to receive wall sections with varying thicknesses. In particular embodiments, the channel width 237 is essentially equal to the slot width 150 (FIG. 3). The channel height 239 may also be essentially equal to the slot height 155 or slot length 157 (FIG. 3).

The first hinge element 202 also includes at least one knuckle 240 having a void 242 therein. In FIG. 7, the first hinge element 202 includes four (4) knuckles 240 that each have a respective void 242. The knuckles 240 are sized and shaped to align with knuckles 280 of the second hinge element 204.

The second hinge element 204 includes an inner surface or side 250 and an outer surface or side 252. In some embodiments, the inner surface 250 faces the cavity 102 (FIG. 1), and the outer surface 252 faces the exterior of the modular enclosure 100. The second hinge element 204 has an elongated body 254 having a length 256. The elongated body 254 extends linearly between opposite ends 258, 260. The opposite ends 258, 260 are defined by respective surfaces 262. The surfaces 262 may be formed when the second hinge element 204 is cut. As shown, the entire surface 262 is planar (e.g., coincides with a single plane). The surfaces 262 may have cross-sectional dimensions that, in some embodiments, are maintained throughout the length 256.

The second hinge element 204 includes an open-sided channel 270 that extends parallel to the hinge axis 206. The open-sided channel 270 opens along the length 256 and at each of the ends 258, 260. More specifically, the open-sided channel 270 opens in a direction $D_9$ that is perpendicular to the corresponding axis 206, and opens in the directions $D_7$, $D_8$ that are along the axis 206. In particular embodiments, the second hinge element 204 has a uniform cross-section such that the first hinge element may be sliced perpendicular to the axis 206 at any point and the exposed end may have the same cross-sectional dimensions as before.

The open-sided channel 270 may be sized, shaped, and positioned to receive portions of a wall section 302 (shown in FIG. 7). The open-sided channel 270 is defined by a first hinge wall 274 and a second hinge wall 276. The first hinge wall 274 defines a portion of the cavity 102 (FIG. 1). The open-sided channel 270 has a channel width, a channel length, and a channel height, which are not shown, but may be similar to the other channel widths, channel lengths, and channel heights described above. The channel width is configured relative to the wall section that the corresponding channel will receive.

The second hinge element 204 also includes at least one knuckle 280 having a void (not shown) therein. In FIG. 7, the second hinge element 204 includes three (3) knuckles 280 that each have a respective void. In some embodiments, the knuckles 240, 280 align with one another such that a pin (not shown) may be inserted through the voids. In other embodiments, a pin is not used and the knuckles 240, 280 are shaped to couple to one another through an interference fit.

Figure 8:
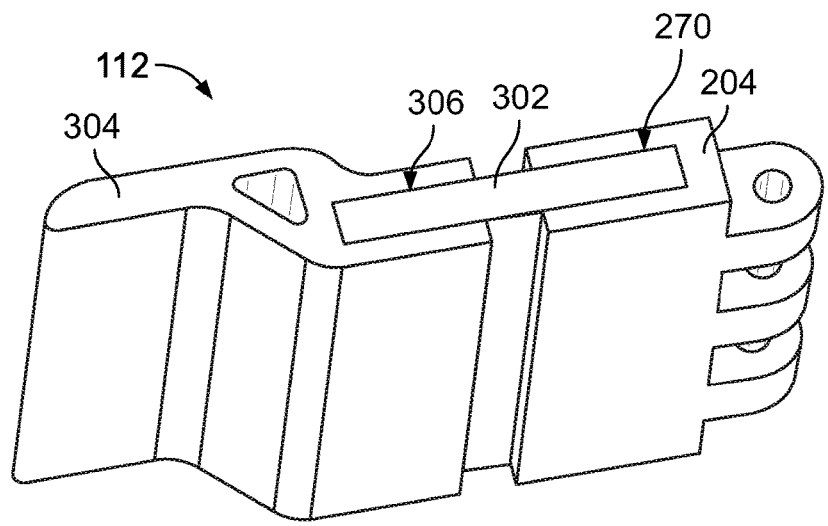
FIG. 8 illustrates a cover device that may be used with the modular enclosure of FIG. 1.

FIG. 8 illustrates the cover device 112 that includes a wall section 302 and a discrete cover 304. In the illustrated embodiment, the cover device 112 is attached to the second hinge element 204 of the hinge device 114 (FIG. 7). As shown, the wall section 302 is inserted into the open-sided channel 270 of the second hinge element 204 and into an open-sided channel 306 of the discrete cover 304. The open-sided channel 306 may be similar to the open-sided channel 270 or other open-sided channels set forth herein. In alternative embodiments, a cover device may be devoid of the discrete cover 304. Instead, the wall section 302 may form the cover of the cover device. Yet in other embodiments, a cover device may be devoid of the wall section 302 and the discrete cover 304. Instead, the second hinge element may form the cover of the cover device.

Figure 9:
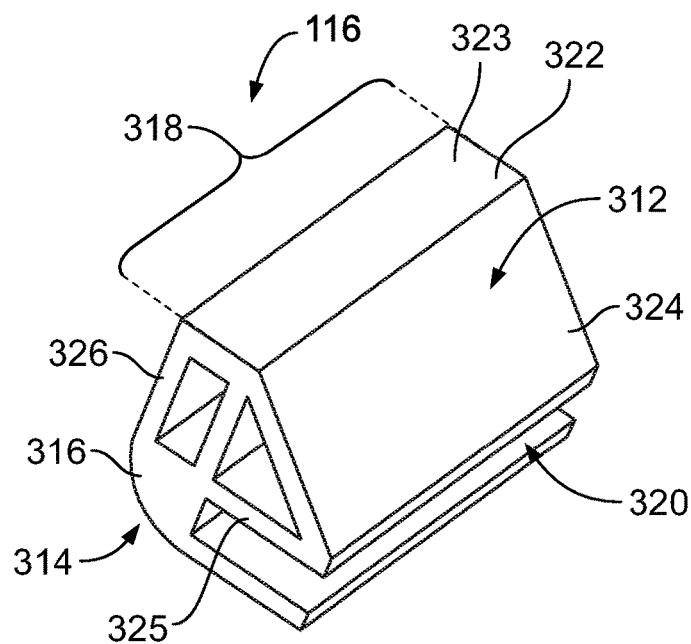
FIG. 9 is an isolated perspective view of a support section that may be used with the modular enclosure of FIG. 1.

FIG. 9 is an isolated perspective view of a support section 116 that may be used with the modular enclosure 100 (FIG. 1). The support section 116 may replace the joint section in some embodiments. In the illustrated embodiment, the support section 116 may at least partially define the access opening 103 (FIG. 1) through which one may access the cavity 102 (FIG. 1). As such, the support section 116 may form part of a cover or door frame. The modular enclosure 100 (FIG. 1) includes two (2) support sections 116, but fewer or more may be used in other embodiments.

The support section 116 includes an inner surface or side 312 and an outer surface or side 314. In some embodiments, the inner surface 312 faces the cavity 102 (FIG. 1), and the outer surface 314 faces the exterior of the modular enclosure 100. The support section 116 has an elongated body 316 having a length 318. The length 318 may be indeterminate and may be selected based upon the intended purpose of the modular enclosure. In some embodiments, the elongated body 316 may be rigid or inflexible.

The support section 116 includes features that are similar to the joint section 106 (FIG. 1). For example, the support section 116 includes an open-sided channel 320 that may be similar or identical to the other open-sided channels described herein. The open-sided channel 320 is configured to receive a wall section 108 (FIG. 1). However, the support section 116 includes only one open-sided channel 320. In replacement of an additional open-sided channel, the support section 116 includes a column 322. The column 322 is defined by walls 323-326. Each of the walls 323-326 extends lengthwise and each of the walls 323-326 has an orientation that is different than the other walls. In the illustrated embodiment, the walls 323-326 are interconnected with one another such that an open-sided channel does not exist along an exterior. In such instances, the column 322 is an enclosed column 322. The column 322 may provide additional structural integrity compared to the joint section 106.

Figure 10:
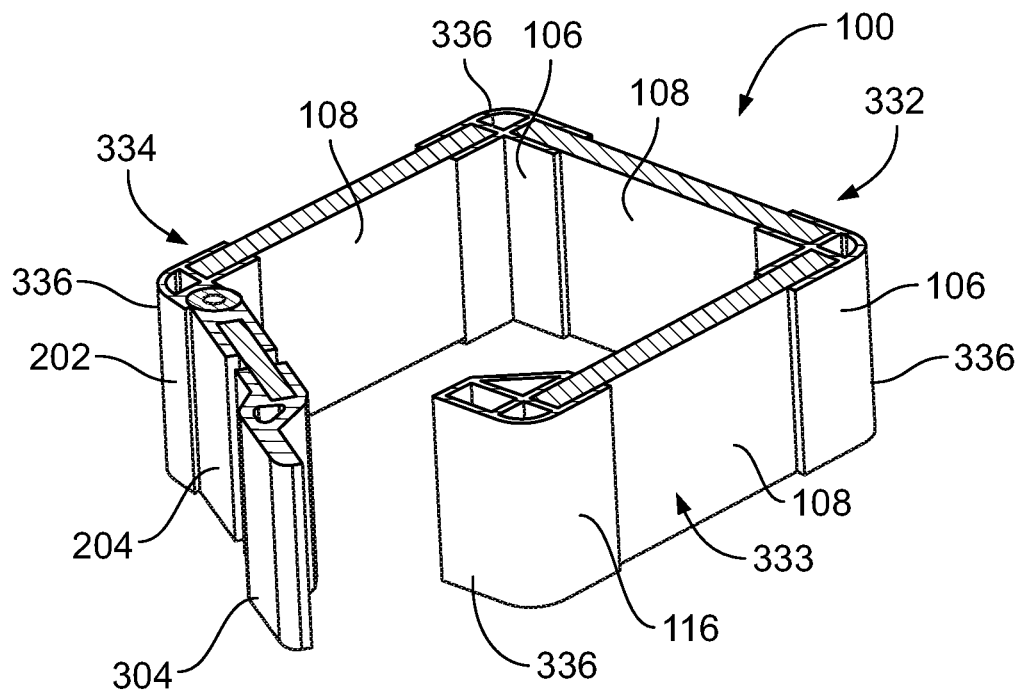
FIG. 10 is a sectional view of the modular enclosure of FIG. 1.
Figure 11:
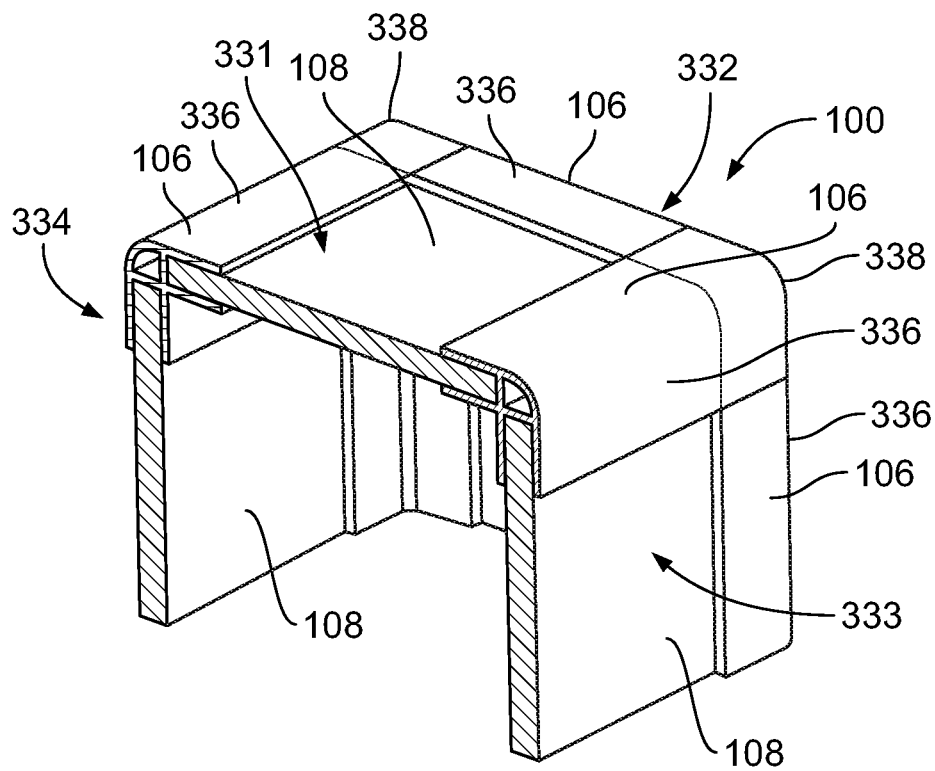
FIG. 11 is another sectional view of the modular enclosure of FIG. 1.

FIGS. 10 and 11 are sectional views of the modular enclosure 100 and illustrate how the different structural elements of the modular enclosure 100 may be coupled to one another. As described herein, dimensions of some of the structural elements are indeterminate, thereby allowing a user to select the dimensions of the modular enclosure that are needed for the particular application. For example, in the illustrated embodiment, each of the joint sections 106, the wall sections 108, the first and second hinge elements 202, 204, the support sections 116, the wall section 302, and the discrete cover 304 may be cut from a larger object. The remainder of the larger object may then be used to make other structural elements.

As shown in FIGS. 10 and 11, the modular enclosure 100 may be box-shaped having at least four sides 331-334 that join each other along enclosure edges 336 and enclosure corners 338. The enclosure corners 338 are formed by the corner sections 104. The enclosure edges 336 include the joint sections 106 and portions of the corner sections 104.

Figure 12:
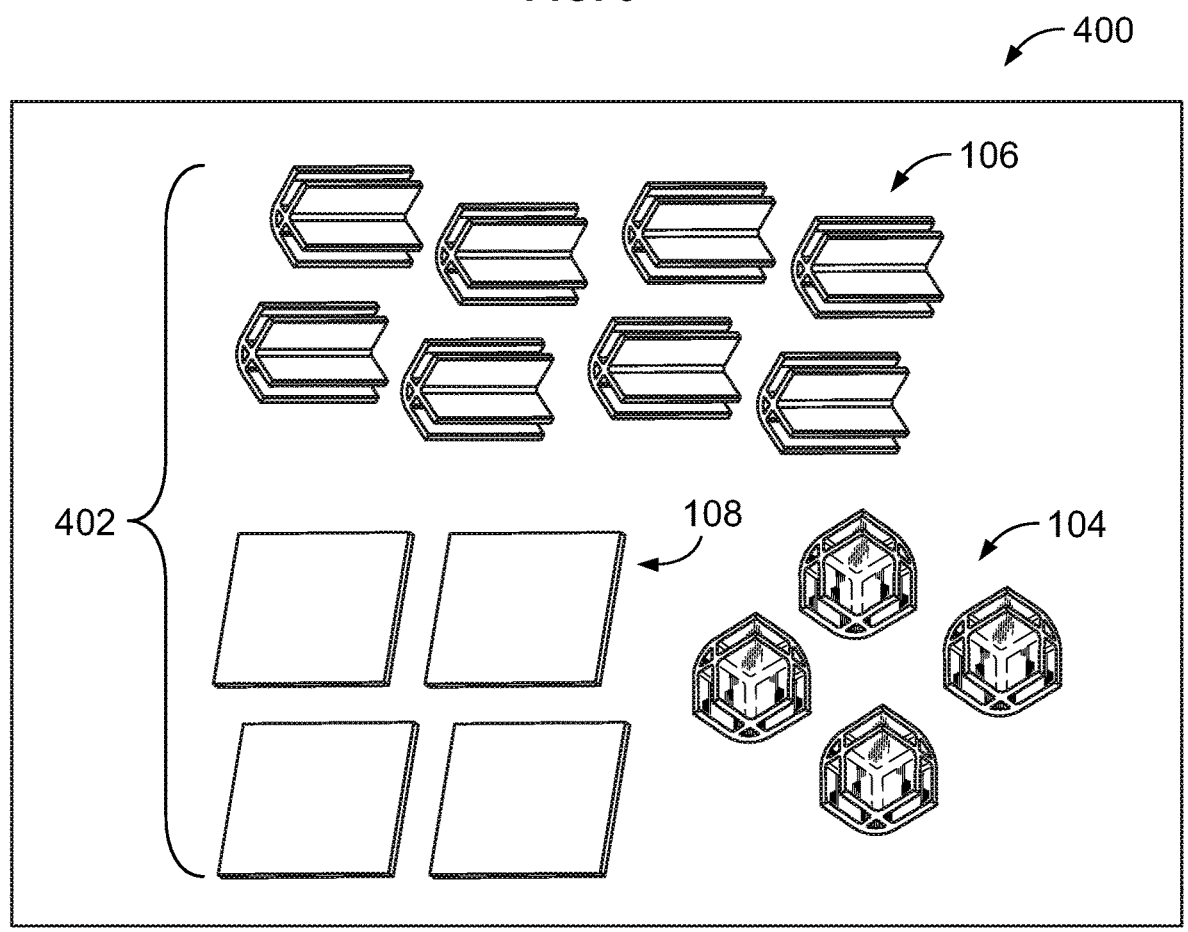
FIG. 12 illustrates an assembly formed in accordance with an embodiment for constructing a modular enclosure.

FIG. 12 illustrates a packaged assembly 400 that may be used to construct a modular enclosure, such as the modular enclosure 100 (FIG. 1). The packaged assembly 400 includes a set 402 of structural elements. The structural elements may include, for example, the joint sections 106, the corner sections 104, and wall sections 108, among other elements. The joint sections 106 and the wall sections 108 may be cut from larger elements. As such, the set 402 may be "cut-to-order" and placed within a container 404, such as a box or bag, for shipping.

Figure 19:
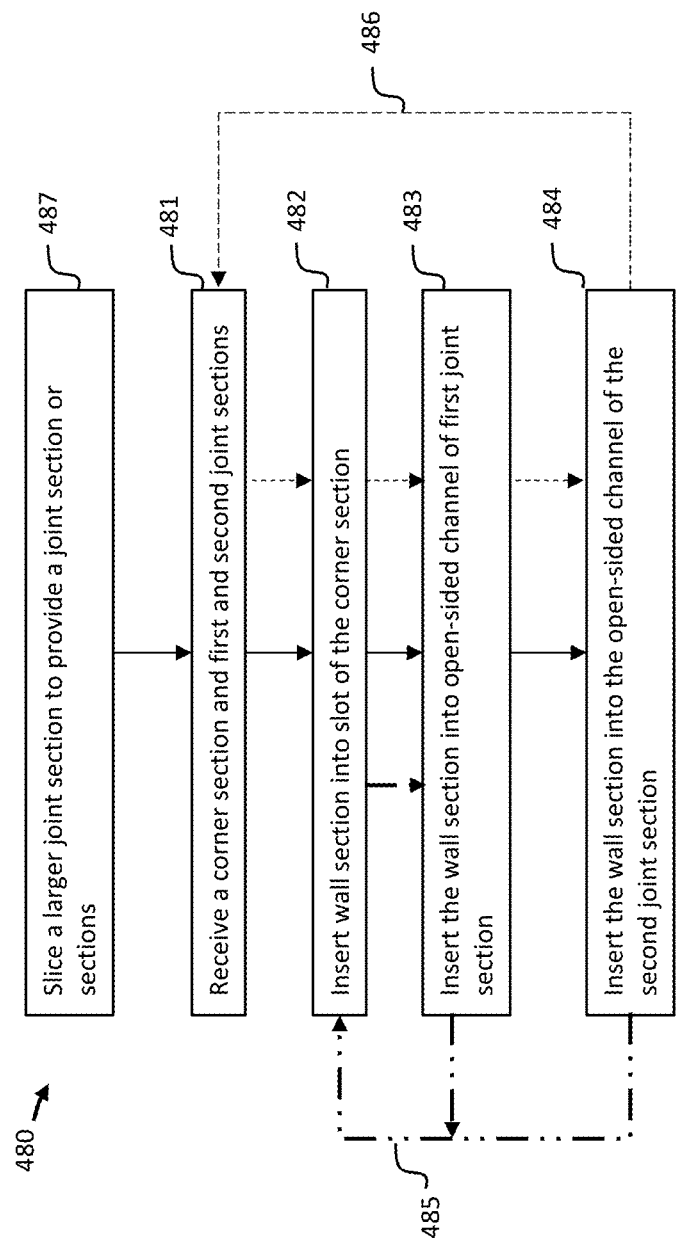
FIG. 19 is a flow chart illustrating a method in accordance with an embodiment.

FIG. 19 is a flow chart illustrating a method in accordance with an embodiment. The method may include using the structural elements set forth herein. The method may include (a) receiving, at 481, a corner section and first and second joint sections. The corner section has first and second slots. Each of the first and second joint sections includes an elongated body extending between two joint ends. The elongated body has an open-sided channel that extends along a length of the elongated body and opens to an exterior of the elongated body. The open-sided channel extends through each of the joint ends. The method also includes (b) inserting, at 482, a wall section into the slot of the corner section and (c) inserting, at 483, the wall section into the open-sided channel of the first joint section. The open-sided channel of the first joint section and the slot of the corner section are aligned. The method also includes (d) inserting, at 484, the wall section into the open-sided channel of the second joint section. The open-sided channel of the second joint section and the slot of the corner section are aligned. The method also includes (e) repeating (b) and (c), at 485, with a different wall section for a different slot of the corner section in which the first joint section includes another open-sided channel such that the two wall sections are inserted into the two open-sided channels of the first joint section.

In some embodiments, the method also includes (f) repeating (a)-(e), at 486, with a different corner section, different first and second joint sections, and different wall sections. In some embodiments, (b)-(e) are carried out sequentially or in a different order. In some embodiments, the method also includes slicing, at 487, a larger joint section to provide at least one of the first joint section or the second joint section.

Figure 13:
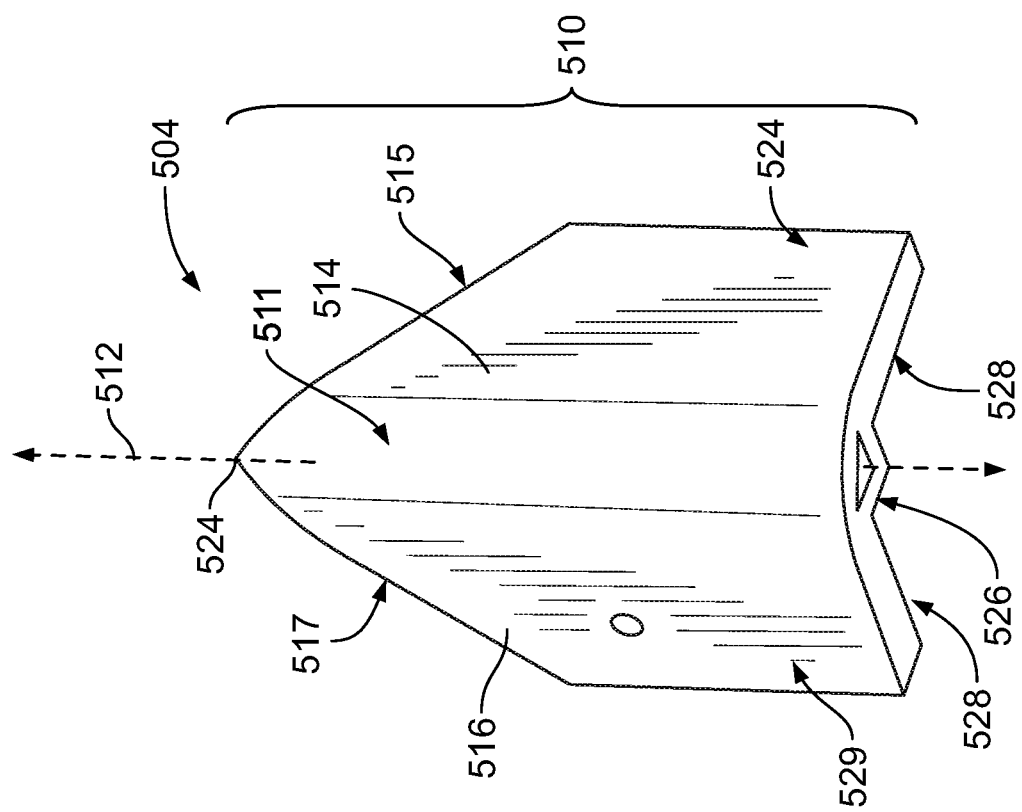
FIG. 13 is an isolated perspective view of a joint section that may be used to assemble a modular enclosure.
Figure 14:
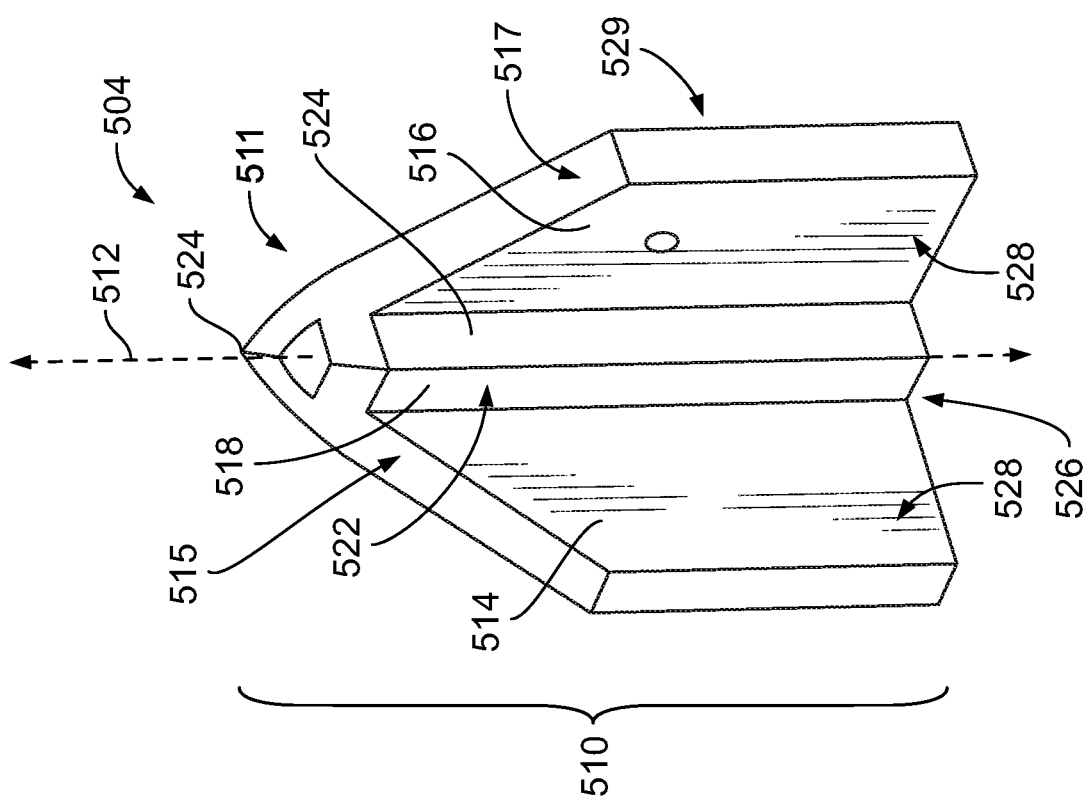
FIG. 14 is another isolated perspective view of the joint section that may be used to assemble a modular enclosure.
Figure 15:
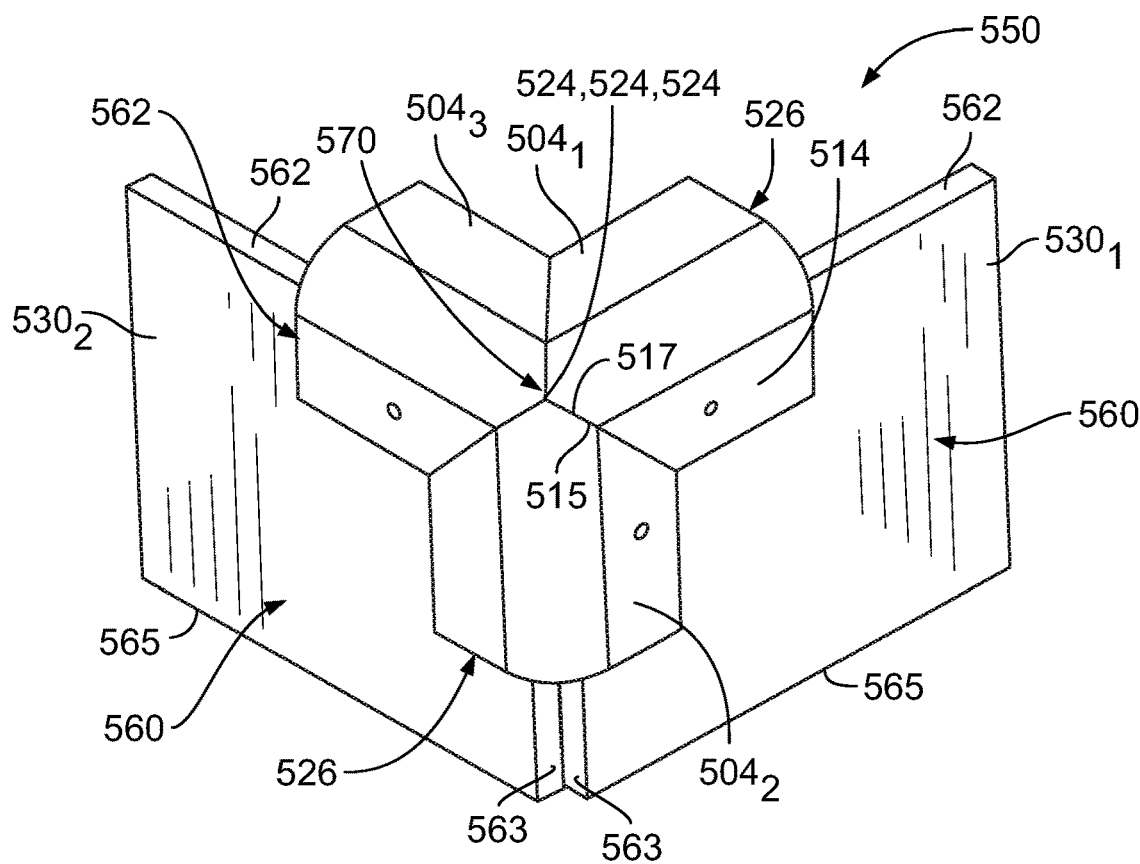
FIG. 15 illustrates a modular enclosure in accordance with an embodiment.
Figure 16:
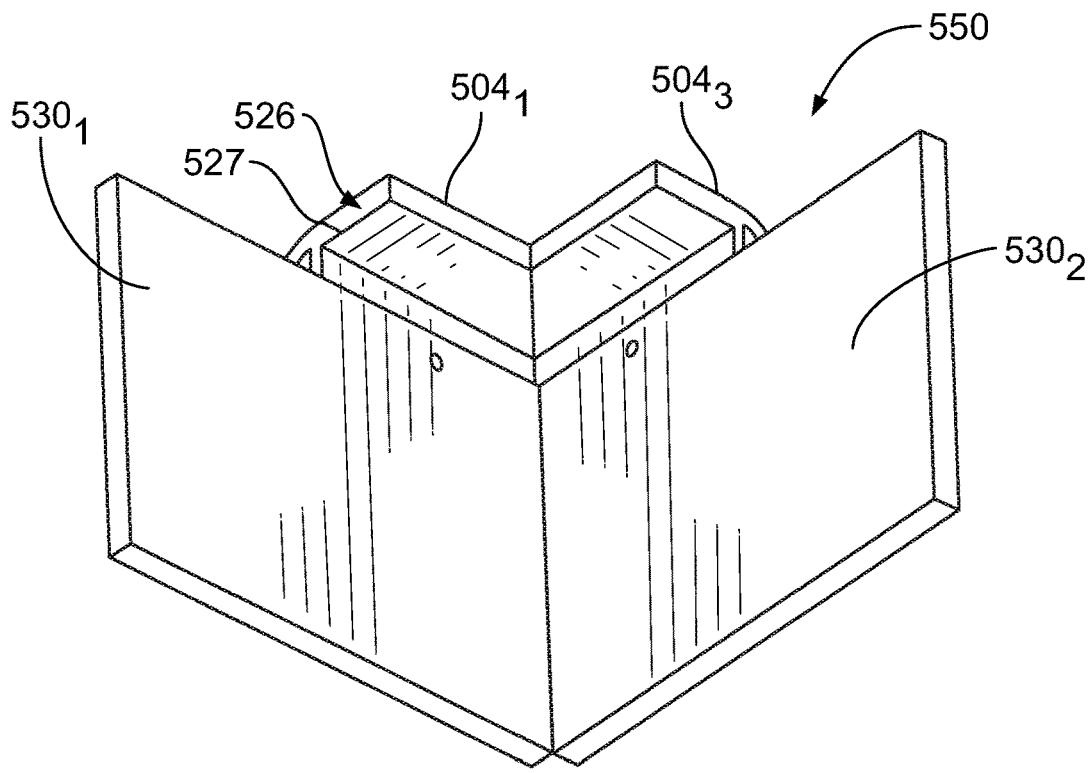
FIG. 16 illustrates another view of the modular enclosure of FIG. 15.

FIGS. 13 and 14 are isolated inner and outer perspective views, respectively, of the joint section 504. The joint section 504 may be used to form a modular enclosure, a portion of which is shown in FIGS. 15 and 16. Optionally, the joint section 504 may be used with other joint sections, such as the joint section 106 (FIG. 1). The joint section 504 has a length (or height) 510 and extends lengthwise along a longitudinal axis 512. The length 510 is indeterminate. The joint section 504 includes a pair of outer walls 514, 516 that join each other at a corner portion 511 of the joint section 504. In the illustrated embodiment, the outer walls 514, 516 are oriented orthogonal to each other. The outer walls 514, 516 have an inner surface 528 and an exterior surface 529. The inner surface 528 is configured to abut a portion of a corresponding wall section 530 (FIG. 15).

The corner portion 511 includes a contoured segment 518 having first and second abutting surfaces 522, 524. The contoured segment 518 extends parallel to the longitudinal axis 512. The contoured segment 518 is shaped relative to the wall sections 530 (FIG. 15) that the contoured segment 518 may engage. In some embodiments, the contoured segment 518 may also enhance the structural integrity of the joint section 504.

The length 510 is measured between a tapered end 524 and an opposite end 526 of the corner portion 504. The opposite end 526 is defined by the corner segment 518 in FIG. 13. The length 510 may be determined during manufacturing. For example, the joint section 504 may have a much longer dimension than shown in FIGS. 13 and 14. The joint section 504 may be cut or sliced to form the joint section 504 as shown. As such, the opposite end 526 and the length 510 may be defined by the cutting or slicing process.

The outer walls 514, 516 include mating edges 515, 517, respectively. The mating edges 515, 517 approach each other as the mating edges 515, 517 approach the tapered end 524. In the illustrated embodiment, the mating edges 515, 517 have similar slopes or contours. In other embodiments, the mating edges 515, 517 may have different slopes.

FIGS. 15 and 16 illustrate perspective views of a portion of a modular enclosure 550. The modular enclosure 550 includes the joint sections 504 and the wall sections 530. The portion of the modular enclosure 550 shown in FIGS. 15 and 16 may be referred to as a sub-assembly. Additional joint sections 504 and wall sections 530 may be combined to form the complete modular enclosure 550. Optionally, the modular enclosure 550 may include other structural elements, such as the other structural elements described herein.

Three joint sections 504 and two wall sections 530 are shown in FIGS. 15 and 16. To construct the sub-assembly, a single wall section may be positioned such that an outer surface of the wall section abuts the inner surface of one of the outer walls of the joint section and a wall edge of the wall section engages the corresponding abutting surface. For example, the wall section $530_1$ may be positioned such that an outer surface 560 of the wall section $530_1$ abuts or interfaces with the inner surface 528 (FIG. 13) of the outer wall 516 of the joint section $504_1$. The wall section $530_1$ may be positioned such that a wall edge 562 engages the corresponding abutting surface 524 (FIG. 13). The joint section $504_1$ and the wall section $530_1$ may be secured to one another using a fastener (e.g., rivet, nail, staple, etc.) and/or an adhesive.

After securing the wall section $530_1$ and the joint section $504_1$ to each other, an additional joint section $504_2$ may be secured to the wall section $530_1$. The tapering ends 524 of the joint sections $504_1$, $504_2$ are positioned adjacent to one another and the mating edges 517 and 515 of the joint sections $504_1$, $504_2$ abut each other. The wall section $530_1$ may be positioned such that a wall edge 563 engages the corresponding abutting surface 522 (FIG. 13) of the joint section $504_2$.

A wall section $530_2$ may be positioned such that an outer surface 560 of the wall section $530_2$ abuts or interfaces with the inner surface 528 (FIG. 13) of the outer wall 514 of a joint section $504_3$. The wall section $530_2$ may be positioned such that the wall edge 562 engages the corresponding abutting surface 522 (FIG. 13). The joint section $504_3$ and the wall section $530_2$ may be secured to one another using a fastener (e.g., rivet, nail, staple, etc.) and/or an adhesive. Subsequently, the secured joint and wall sections $504_3$, $530_2$ may be combined with the secured joint sections $504_1$, $504_2$ and wall section $530_1$ such that the wall edge 563 of the wall section $530_2$ engages the abutting surface 523 of the joint section $504_2$. The joint section $504_2$ and the wall section $530_2$ may be secured to one another using a fastener (e.g., rivet, nail, staple, etc.) and/or an adhesive, thereby forming the portion of the modular enclosure 550 shown in FIGS. 15 and 16. As shown, the tapered end 524 engages the other tapered ends 524 to form an enclosure corner 570 of the modular enclosure 550.

The above steps may be repeated to form the complete modular enclosure 550, which may appear similar to the modular enclosure 100. The joint sections 504 may be sized and shaped such that the ends 526 of the joint sections 504 abut other ends 526. The ends 526 may be defined by a surface 527 (shown in FIG. 16). Alternatively, one or more of the joint sections 504 may be sized and shaped such that the end 526 is flush or even with edges of the wall sections 530 and rests upon or interfaces with a ground surface (e.g., shelf, table, etc.). For example, with respect to FIG. 15, the end 526 of the joint section $504_2$ may be configured such that the end 526 is flush or even with edges 565 of the wall sections $530_1$, $530_2$.

Figure 17:
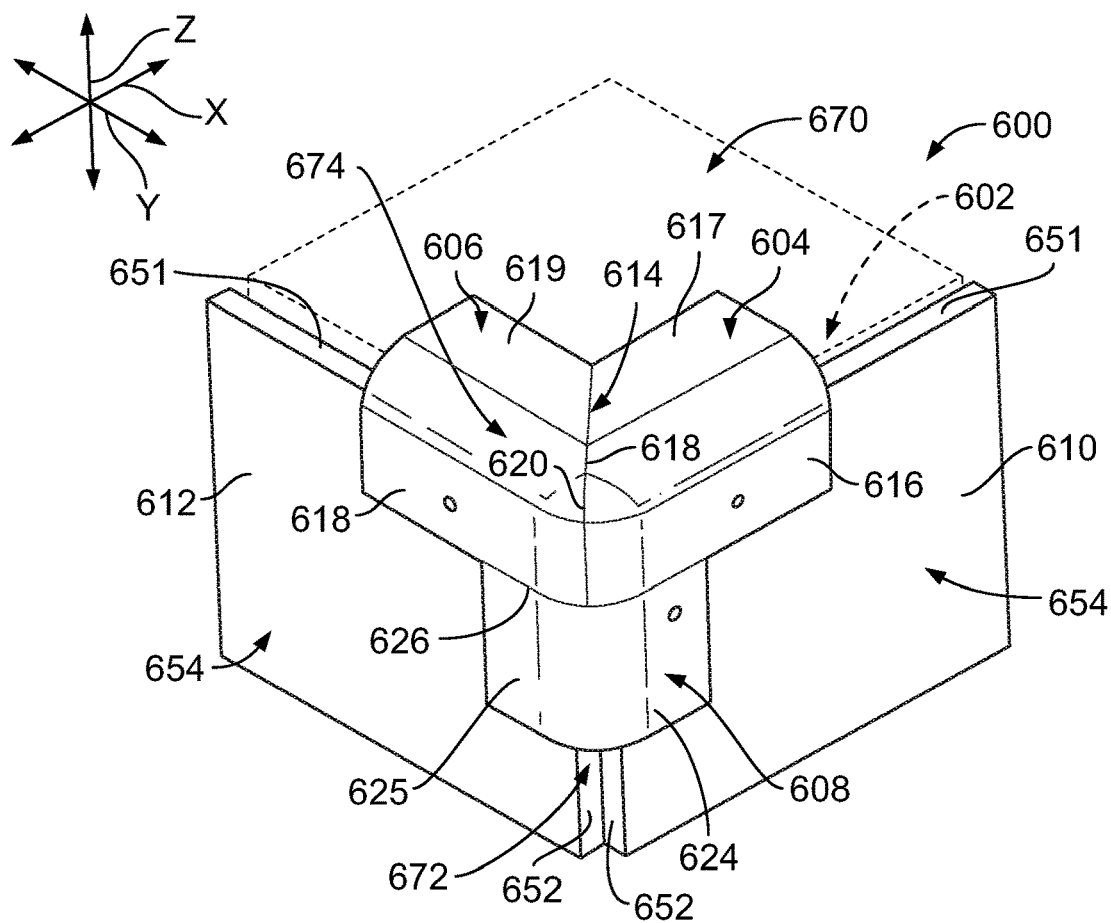
FIG. 17 illustrates a modular enclosure in accordance with an embodiment.

FIG. 17 is a perspective view of a portion of a modular enclosure 600 in accordance with an embodiment. The modular enclosure 600 may be similar to the modular enclosure 550 (FIG. 15). For example, the modular enclosure 600 includes a plurality of structural elements that are coupled to one another to at least partially define a cavity 602. The structural elements include a joint section 604, a joint section 606, a joint section 608, and two wall sections 610, 612. The wall sections 610, 612 may be similar or identical to other wall sections described herein. The wall sections 610, 612 have first and second wall edges 651, 652 and an outer surface 654. The first and second wall edges 651, 652 join each other.

The first and joint sections 604, 606 are shaped to engage one another along a seam or interface 614. The joint section 604 has a pair of outer walls 616, 617 and a mating edge 618 that extends along each of the outer walls 616, 617. The outer walls 616, 617 are arranged orthogonal or perpendicular to each other. The outer wall 616 extends generally parallel to the XZ plane. The outer wall 617 extends generally parallel to the XY plane. The mating edge 618 extends parallel to the XY plane along a side 670 of the modular enclosure 600 and parallel to the Z axis along an edge 672 of the modular enclosure 600. The side 670 of the modular enclosure extends along and parallel to one wall section. The edge 672 of the modular enclosure exists along the joint section where two wall sections interface with each other at an angle. The edge 672 extends between opposite corners 674.

Although not shown, the outer walls 616, 617 have respective inner surfaces. The joint section 604 may also include a contoured segment (not shown) that is similar or identical to the contoured segment 518 (FIG. 13) and having first and second abutting surfaces.

Similarly, the joint section 606 has a pair of outer walls 618, 619 and a mating edge 620 that extends along each of the outer walls 618, 619. The outer walls 618, 619 are arranged orthogonal or perpendicular to each other. The outer wall 618 extends generally parallel to the XY plane. The outer wall 619 extends generally parallel to the XY plane. The mating edge 620 extends parallel to the XY plane along a side of the modular enclosure 600 and parallel to the Z axis along an edge of the modular enclosure 600.

Although not shown, the outer walls 618, 619 have respective inner surfaces. The joint section 606 may also include a contoured segment (not shown) that is similar or identical to the contoured segment 518 (FIG. 13) and having first and second abutting surfaces.

The joint section 608 has a pair of outer walls 624, 625 and a mating edge 626 that extends along each of the outer walls 618, 619. The outer walls 624, 625 are arranged orthogonal or perpendicular to each other. Although not shown, the outer walls 624, 625 have respective inner surfaces. The outer wall 624 extends generally parallel to the XZ plane. The outer wall 625 extends generally parallel to the YZ plane. The mating edge 626 extends generally parallel to the XY plane. The mating edge 626 extends generally parallel to the Y axis while extending along the wall section 612 and generally parallel to the X axis while extending along the wall section 610.

The joint section 608 may also include a contoured segment (not shown) that is similar or identical to the contoured segment 518 (FIG. 13) and having first and second abutting surfaces.

As shown, the joint section 604 is secured to the wall section 610. The inner surface of the outer wall 616 abuts the outer surface 654 of the wall section 610 and extends along the first wall edge 651. The joint section 606 is secured to the wall section 612. The inner surface of the outer wall 618 of the joint section abuts the outer surface 654 of the wall section 612 and extends along the first wall edge 651 of the wall section 612. The mating edges 618, 620 of the first and joint sections 604, 606 engage each other along at least one of the first or second wall edges 651, 652. The mating edges 618, 620 are shaped to form a corner 674 of the modular enclosure.

The joint section 608 may be secured to the wall section 610 or the wall section 612. The inner surfaces of the outer walls 624, 625 of the joint section 608 abut the outer surfaces 654 of the wall sections 610, 612 and extend along respective second wall edges 652. The mating edges 618, 620. 626 of the first, second, and joint sections 604, 606, 608 engage one another. More specifically, each of the joint sections engages the mating edges of the two other joint sections. The mating edge 620 engages the mating edges 618, 626. The mating edge 618 engages the mating edges 620, 626. The mating edge 626 engages the mating edges 618, 620. The various joint sections and corner sections cooperate with one another to form a support frame that securely holds the wall sections.

Figure 18:
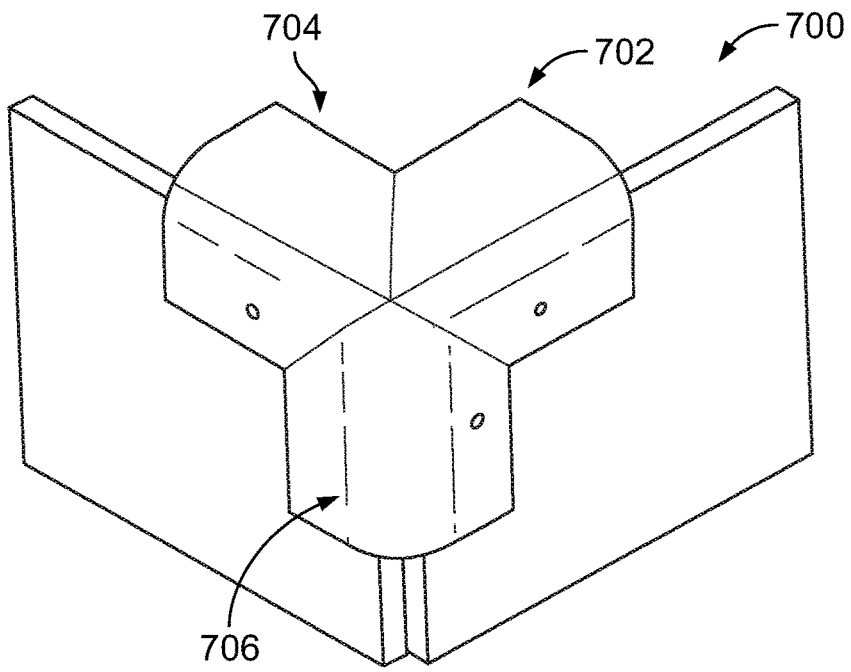
FIG. 18 illustrates a modular enclosure in accordance with an embodiment.

FIG. 18 is a perspective view of a portion of a modular enclosure 700 in accordance with an embodiment. The modular enclosure 700 may be similar to the modular enclosure 550. For example, the joint sections 702, 704, and 706 are identical and may be coupled to one another and the wall sections to form the modular enclosure 700. Unlike the modular enclosure 550, in which the joint sections have rounded edges, the joint sections 702, 704, and 706 form sharp corners such that the complete modular enclosure 700 is box-shaped.

It is noted that the terms "first," "second," and "third," in the following claims are used as labels to distinguish one element over another different element, and are not intended to impose numerical requirements on their objects. Moreover, it is possible that a single element may have a different label depending upon the interpretation of the claims. For example, a joint section in one interpretation of the claims may be labeled as the second joint section or, in a different interpretation of the claims, may be labeled as the third joint section.

Regarding the embodiments described herein, it should be understood that similar elements may have different sizes and/or shapes. For example, two wall sections may have different shapes, and two joint sections 504 may have different dimensions. The structural elements may be manufactured using one or more processes. For example, the structural elements may be molded, extruded, or 3D-printed. Optionally, the structural elements may be formed with another element. In particular embodiments, the joint sections 504 may have one or more indeterminate dimensions.

The structural elements may be combined to form a modular enclosure of a desired size and shape. In other words, the size and shape may be selected by the intended user. The user may assemble the modular enclosures or may request that the vender or manufacturer assemble the modular enclosures prior to shipping.

It should be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

What is claimed is:

1. A modular enclosure comprising:
    a plurality of structural elements coupled to one another to at least partially define a cavity, the structural elements forming a plurality of sub-assemblies in which each sub-assembly includes:
    a corner section having a slot, wherein the corner section includes a first side face and a second side face that face in different directions, the slot extending through each of the first and second side faces such that a first slot opening to the slot is located on the first side face and a second slot opening to the slot is located on the second side face;
    first and second joint sections, each of the first and second joint sections having a length extending between two joint ends, each of the first and second joint sections having an open-sided channel that extends along the length, each of the first and second joint sections having a channel opening to the open-sided channel at one of the joint ends; and
    wherein the first side face opposes and abuts one of the joint ends of the first joint section and the second side face opposes and abuts one of the joint ends of the second joint section, the channel opening of the first joint section being aligned with the first slot opening of the first side face and the channel opening of the second joint section being aligned with the second slot opening of the second side face, wherein a wall section is received by the slot and each of the open-sided channels;
    wherein the wall section engages the corner section, the first joint section, and the second joint section through respective interference fits in the slot and the open-sided channels, and wherein the modular enclosure is devoid of connecting structure extending between the corner section and either of the first and second joint sections, such that only the wall section connects the corner section to the first and second joint sections by extending between the corner section and the first and second joint sections.

2. The modular enclosure of claim 1, wherein the plurality of sub-assemblies includes two of the sub-assemblies that share the corner section and the first joint section or the second joint section.

3. The modular enclosure of claim 1, wherein the plurality of sub-assemblies includes first, second, and third sub-assemblies, the first, second, and third sub-assemblies sharing the corner section, the first and second sub-assemblies sharing the first joint section, the first and third sub-assemblies sharing the second joint section.

4. The modular enclosure of claim 1, wherein the modular enclosure is box-shaped having at least four sides that join each other along enclosure edges and enclosure corners, the enclosure corners being formed by the corner sections, the enclosure edges being formed by the first and second joint sections and additional joint sections.

5. The modular enclosure of claim 1, wherein at least one of the first or second joint sections has uniform cross-sectional dimensions such that any cross-section of the at least one first or second joint section taken perpendicular to the length essentially has an identical cross-sectional size and shape as a size and shape of the joint end of the at least one first or second joint section.

6. The modular enclosure of claim 1, wherein the slot is a first slot and the corner section includes second and third slots, the first, second, and third slots receiving respective wall sections.

7. The modular enclosure of claim 1, wherein each of the first and second joint sections is a unitary body formed from material having a uniform composition.

8. The modular enclosure of claim 1, wherein each of the first and second joint sections is rigid and extends linearly between the joint ends.

9. The modular enclosure of claim 1, wherein the joint end of the first joint section that opposes and abuts the first side face includes a planar surface.

10. An assembly for constructing one or more modular frames, the assembly comprising:
a plurality of corner sections, each of the corner sections having a plurality of slots that are sized and shaped to receive corners of respective wall sections; and
a plurality of joint sections that are configured to be positioned with respect to the corner sections, the plurality of joint sections including first and second joint sections, each of the first and second joint sections comprising:
a length extending between two joint ends; and
open-sided channels extending along the length and opening to an exterior, the open-sided channels extending through each of the joint ends;
wherein one of the slots of at least one of the corner sections is configured to align with one of the open-sided channels of the first joint section and one of the open-sided channels of the second joint section, the one of the slots of the at least one corner section and the one of the open-sided channels of the first joint section being sized and shaped and being positionable to receive one of said respective wall sections, the one of the slots of the at least one corner section and the one of the open-sided channels of the second joint section being sized and shaped and being positionable to receive the one of said respective wall sections, wherein the one of the slots of the at least one corner section does not receive the first joint section or the second joint section in a pluggable engagement;
wherein the one of said respective wall sections engages the at least one corner section, the first joint section, and the second joint section through respective interference fits in the one of the slots and the open-sided channels, and wherein the assembly is devoid of connecting structure extending between the at least one of the corner sections and either of the first and second joint sections, such that only the one of said respective wall sections connects the at least one of the corner sections to the first and second joint sections by extending between the corner section and the first and second joint sections.

11. The assembly of claim 10, further comprising a plurality of wall sections including the one of said respective wall sections.

12. The assembly of claim 10, wherein each of the first and second joint sections extends along a longitudinal axis, each of the first and second joint sections having a uniform cross-sectional shape along the length such that a cross-section taken perpendicular to the longitudinal axis is essentially the same along the length.

13. The assembly of claim 10, wherein the one of said respective wall sections is a first wall section, the assembly further comprising a second wall section and a hinge device having a first hinge element and a second hinge element that are rotatably coupled, the first hinge element having an open-sided channel that is configured to receive the first wall section, the second hinge element having an open-sided channel configured to receive the second wall section.

14. The assembly of claim 10, wherein at least one of the corner sections includes three slots that are mutually perpendicular.

15. The assembly of claim 10, wherein each of the first and second joint sections is a unitary body formed from material having a uniform composition and wherein each of the first and second joint sections is rigid and extends linearly between the joint ends.

16. The assembly of claim 10, wherein the assembly is a packaged assembly that includes a container, the container having the corner and joint sections disposed therein.

17. The modular enclosure of claim 10, wherein at least one of the first or second joint sections has uniform cross-sectional dimensions such that any cross-section of the at least one first or second joint section taken perpendicular to the length essentially has an identical cross-sectional size and shape as a size and shape of the joint end of the at least one first or second joint section.

18. The assembly of claim 10, wherein the ones of the open-sided channels of the first and second joint sections and the one of the slots of the at least one corner section are positioned such that the one of said respective wall sections interfaces with an entirety of the one of the slots and interfaces with an entirety of each of the ones of the open-sided channels.

19. A modular enclosure comprising:
a plurality of structural elements coupled to one another to at least partially define a cavity, the structural elements forming a plurality of sub-assemblies in which each sub-assembly includes:
first and second wall sections;
a corner section having a slot, wherein the corner section includes a first side face and a second side face that face in different directions, the slot extending through each of the first and second side faces such that a first slot opening to the slot is located on the first side face and a second slot opening to the slot is located on the second side face;
first and second joint sections, each of the first and second joint sections having a length extending between two joint ends, each of the first and second joint sections having an open-sided channel that extends along the length, each of the first and second joint sections having a channel opening to the open-sided channel at one of the joint ends; and
wherein the first side face opposes and abuts one of the joint ends of the first joint section and the second side face opposes and abuts one of the joint ends of the second joint section, the channel opening of the first joint section being aligned with the first slot opening of the first side face and the channel opening of the second joint section being aligned with the second slot opening of the second side face, wherein the first wall section is received by the slot and each of the open-sided channels, and wherein the first wall section forms respective interference fits with the corner section, the first joint section, and the second joint section in the slot and the open-sided channels, wherein the modular enclosure is devoid of connecting structure extending between the corner section and either of the first and second joint sections, such that only the first wall section connects the corner section to the first and second joint sections by extending between the corner section and the first and second joint sections;

at least one of the sub-assemblies further comprising:

a hinge element that is rotatably coupled to the second joint section about a hinge axis, the hinge element having an open-sided channel configured to receive and engage the second wall section, the hinge element and the second wall section being rotatable about the hinge axis to close and open access to the cavity.

20. The modular enclosure of claim 19, wherein the first joint section is a support section that partially defines the access opening, the second wall section having an edge that is adjacent to the support section when access to the cavity is closed.

21. The modular enclosure of claim 20, wherein the first joint section has only one open-sided channel.

22. The modular enclosure of claim 19, wherein the first joint section extends along a first longitudinal axis, the first joint section having a uniform cross-sectional shape along the length such that a cross-section of the first joint section taken perpendicular to the first longitudinal axis is essentially the same along the length.

* * * * *